(12) United States Patent
Peng et al.

(10) Patent No.: US 8,270,162 B2
(45) Date of Patent: Sep. 18, 2012

(54) ELECTRONIC DEVICE MODULE WITH MOVABLE SHIELD FOR ANTI-ELECTROMAGNETIC INTERFERENCE

(75) Inventors: Wen-Tang Peng, Taipei Hsien (TW); Xin-Hu Gong, Shenzhen (CN); Gao-Liang Xia, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 242 days.

(21) Appl. No.: 12/881,135

(22) Filed: Sep. 13, 2010

(65) Prior Publication Data

US 2012/0033378 A1 Feb. 9, 2012

(30) Foreign Application Priority Data

Aug. 6, 2010 (CN) .......................... 2010 1 0247542

(51) Int. Cl.
*H05K 7/20* (2006.01)
*F28F 7/00* (2006.01)
*H05K 5/00* (2006.01)

(52) U.S. Cl. .............. 361/693; 361/679.46; 361/679.33; 361/818; 165/185; 454/184

(58) Field of Classification Search .......... 361/692–693, 361/679.46, 679.33, 679.37–679.39, 818; 165/80.2, 185; 257/712; 174/16.1, 547; 454/184

See application file for complete search history.

(56) References Cited

U.S. PATENT DOCUMENTS

| | | | | |
|---|---|---|---|---|
| 4,949,934 A | * | 8/1990 | Krenz et al. .............. | 361/679.46 |
| 6,637,719 B2 | * | 10/2003 | Jiang .............................. | 248/682 |
| 6,660,932 B1 | * | 12/2003 | Barringer et al. ............. | 174/358 |
| 7,079,387 B2 | * | 7/2006 | Brooks et al. ............ | 361/679.51 |
| 7,447,011 B2 | * | 11/2008 | Wade et al. .............. | 361/679.33 |
| 2008/0030946 A1 | * | 2/2008 | Lee ................. | 361/685 |
| 2009/0168328 A1 | * | 7/2009 | Peng et al. ............... | 361/679.46 |

* cited by examiner

*Primary Examiner* — Zachary M Pape
(74) *Attorney, Agent, or Firm* — Altis Law Group, Inc.

(57) ABSTRACT

An electronic device module includes an electronic device, a rack accommodating the electronic device, and a shield adjusting assembly. The rack defines a number of ventilation holes, and the shield adjusting assembly defines a number of through holes. The electronic device is placed in the rack to drive the shield adjusting assembly to a first position in which the through holes align with the ventilation holes. When the electronic device is detached from the rack, the shield adjusting assembly is restored by a resilient element to a second position in which the through holes offset the ventilation holes such that the ventilation holes are shielded.

8 Claims, 4 Drawing Sheets

ELECTRONIC DEVICE MODULE WITH MOVABLE SHIELD FOR ANTI-ELECTROMAGNETIC INTERFERENCE

BACKGROUND

1. Technical Field

The present disclosure relates to an electronic device module and, particularly, to an electronic device module having anti-electromagnetic interference (anti-EMI) efficiency.

2. Description of Related Art

Oftentimes, electronic devices such as data storage devices need to be detached from enclosures of electronic systems, thereby leaving an opening in the enclosures. The opening may permit electromagnetic interference (EMI), and misdirect the airflow in the enclosure, thereby reducing heat dissipation efficiency. Typically, an extra shield is used to cover the opening. However, the extra shield may increase cost and is prone to being lost, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
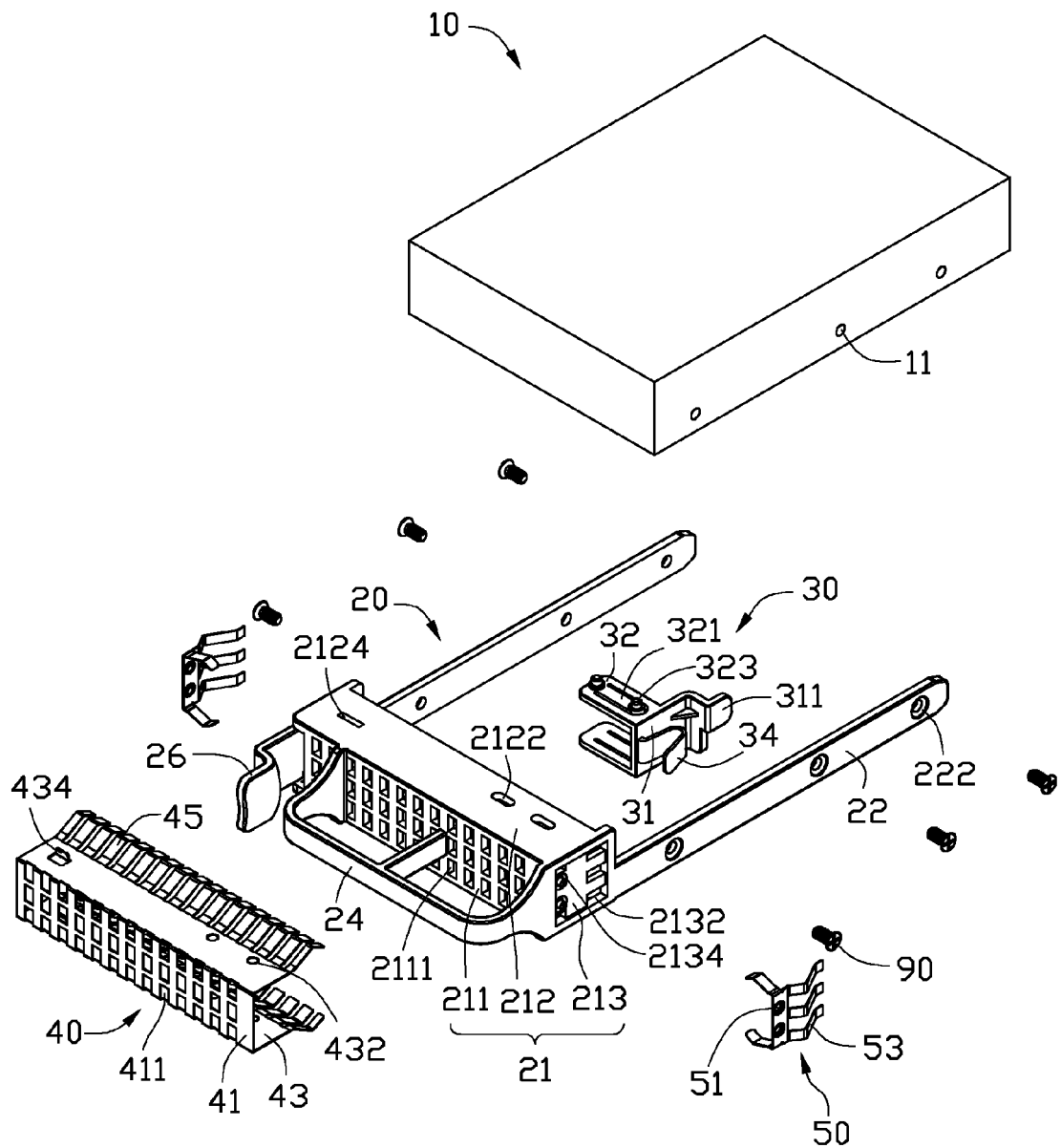
FIG. 1 is an exploded, isometric view of an embodiment of an electronic device module.

Referring to FIG. 1, one embodiment of an electronic device module includes a mounting apparatus, and an electronic device mounted in the mounting apparatus. In this embodiment, the electronic device is a data storage device 10. The mounting apparatus includes a rack 20 for holding the data storage device 10, a shield adjusting assembly movably attached to the rack 20, two anti-EMI plates 50, and a plurality of fasteners. In this embodiment, the shield adjusting assembly includes a movable member 30 and a shield 40, and the fasteners are screws 90.

The data storage device 10 includes a plurality of mounting holes 11 in two opposite sides thereof.

The rack 20 includes a main body 21 and two parallel arms 22 extending from two opposite sides of the main body 21. Each arm 22 defines a plurality of through holes 222 corresponding to the mounting holes 11 of the data storage device 10. The main body 21 includes a first sidewall 211, and two parallel second sidewalls 212 and two parallel third sidewalls 213 extending from four sides of the first sidewall 211 toward the data storage device 10. The first sidewall 211 defines a plurality of ventilation holes 2111 therein. In this embodiment, the ventilation holes 2111 are arranged in matrix, and the distance between every two adjacent columns is not less than the width of each ventilation hole 2111. Two elongated sliding slots 2122 are defined in a side of each second sidewall 212. An elongated latching slot 2124 is defined on the other side of each second sidewall 212. A plurality of locking holes 2132 is defined in and two mounting portions 2134 are formed on each third sidewall 213.

The rack 20 includes a handle 24 extending forward from the first sidewall 211 for facilitating manual operation, and a resilient cantilever locking plate 26 extending forward from one of the third sidewalls 213. A locking block 262 (shown in FIG. 3) extends out from the locking plate 26. The locking block 262 of the locking plate 26 locks the rack 20 to an electronic system enclosure (not shown). The rack 20 can be detached from the enclosure by pressing the locking plate 26 in toward the center of the storage device 10.

The movable member 30 is substantially U-shaped, and includes a main body 31 and two parallel mounting walls 32 extending from upper and lower ends of the main body 31. Each mounting wall 32 defines a U-shaped slot thereby the inner section of the U-shaped slot forming a resilient cantilever tab 321. Two hollow posts 323 are respectively formed from a base end and a free end of the cantilever tab 321. A resilient element is formed from a side of the main body 31 opposite to the mounting walls 32. In this embodiment, the resilient element is a substantially U-shaped resilient tab 34. An L-shaped pressing plate 311 extends out from the main body 31 at the same side thereof from which the resilient tab 34 extends.

The shield 40 is made from a metal sheet for shielding EMI. The shield 40 is substantially U-shaped, and includes a main plate 41, two side plates 43 extending from upper and lower edges of the main plate 41, and a plurality of resilient fingers 45 extending from a distal edge of each side plate 43. The main plate 41 defines a plurality of through holes 411 corresponding to the ventilation holes 2111 of the first sidewall 211. The through holes 411 are arranged in matrix, and the distance between every two adjacent columns is not less than the width of each through hole 411. Each side plate 43 defines two through holes 432 in a side thereof, and forms an upright bent tab 434 from the other side thereof.

The two anti-EMI plates 50 each are made from a metal sheet, and each define two mounting holes 51 and form a plurality of resilient fingers 53.

Figure 2:
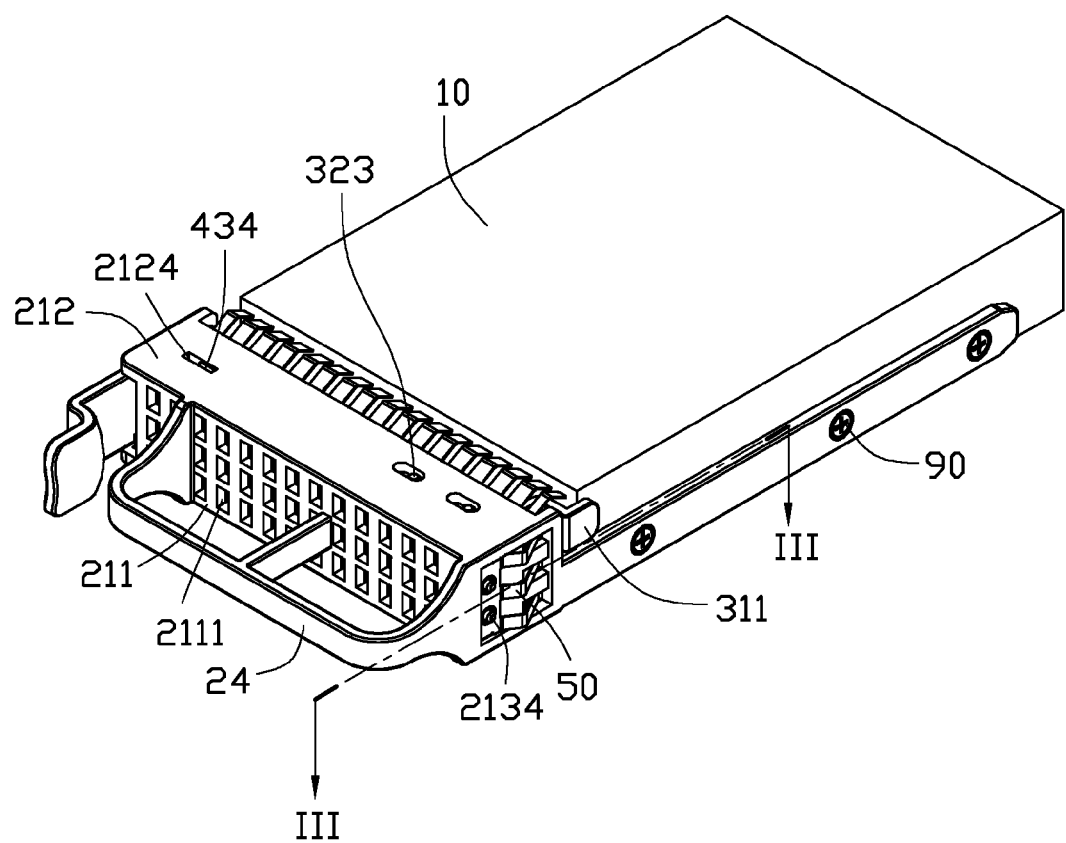
FIG. 2 is an assembled view of FIG. 1.
Figure 3:
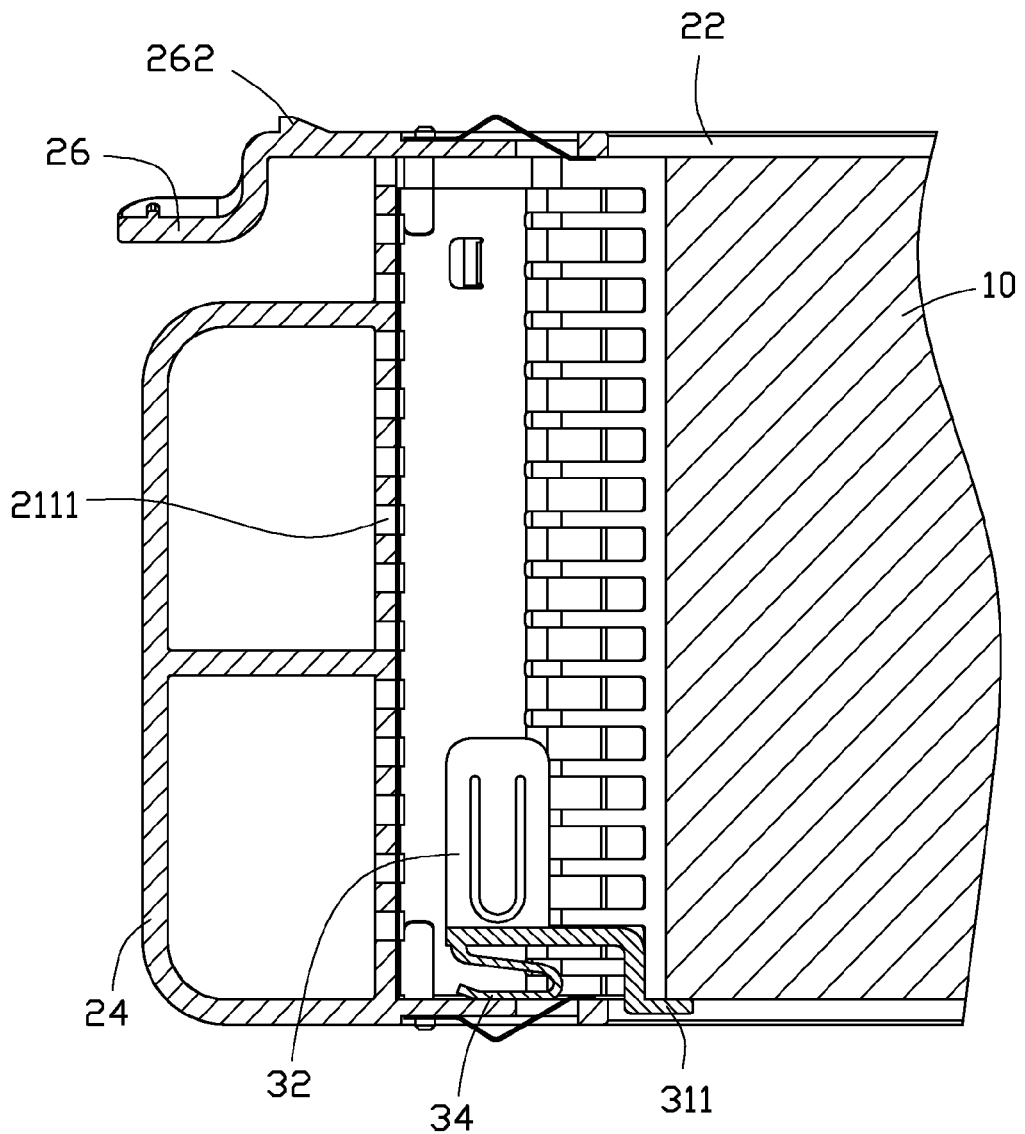
FIG. 3 is a partial, cross sectional view of FIG. 2 taken along line III-III, showing a use state of the electronic device module.

Referring to FIGS. 2 and 3, in assembly, the movable member 30 is placed between the two side plates 43 of the shield 40, with the posts 323 of the mounting walls 32 respectively extending through the through holes 432 of the side plates 43, thus the shield adjusting assembly is assembled. The shield adjusting assembly is placed in the main body 21 of the rack 20, with the bent tabs 434 of the side plates 43 of the shield 40 slidably engaging in the latching slots 2124 of the second sidewalls 212, and the through holes 432 aligning with the elongated sliding slots 2122. The posts 323 of the mounting walls 32 of the movable member 30, after extending through the through holes 432, engage in the elongated sliding slots 2122 of the second sidewalls 212. The resilient tab 34 of the movable member 30 abuts against an inner side of the third sidewall 213 of the main body 21 of the rack 20. The anti-EMI plates 50 are mounted to outer sides of the third sidewalls 213 of the main body 21 of the rack 20, with the mounting portions 2134 of the third sidewalls 213 engaging in the mounting holes 51 of the anti-EMI plates 50, and the resilient fingers 53 of the anti-EMI plates 50 engaging in the locking holes 2132 of the third sidewalls 213. In other embodiment, the resilient tab 34 of the movable member 30 may be changed to other resilient element, such as a spring, that can be sandwiched between the movable member 30 and the rack 20.

In assembling the data storage device 10 to the rack 20, one side of the data storage device 10 resists on an inner side of the pressing plate 311 to move the movable member 30 out until the data storage device 10 is sandwiched between the two arms 22 of the rack 20. The resilient tab 34 is compressed. The screws 90 extend through the through holes 222 of the arms 22 of the rack 20 and engage in the mounting holes 11 of the data storage device 10. Thus, the data storage device 10 is mounted to the rack 20. At the same time, the through holes 411 of the main plate 41 of the shield 40 align with the ventilation holes 2111 of the first sidewall 211 of the rack 20 to facilitate dissipating heat from the data storage device 10.

Figure 4:
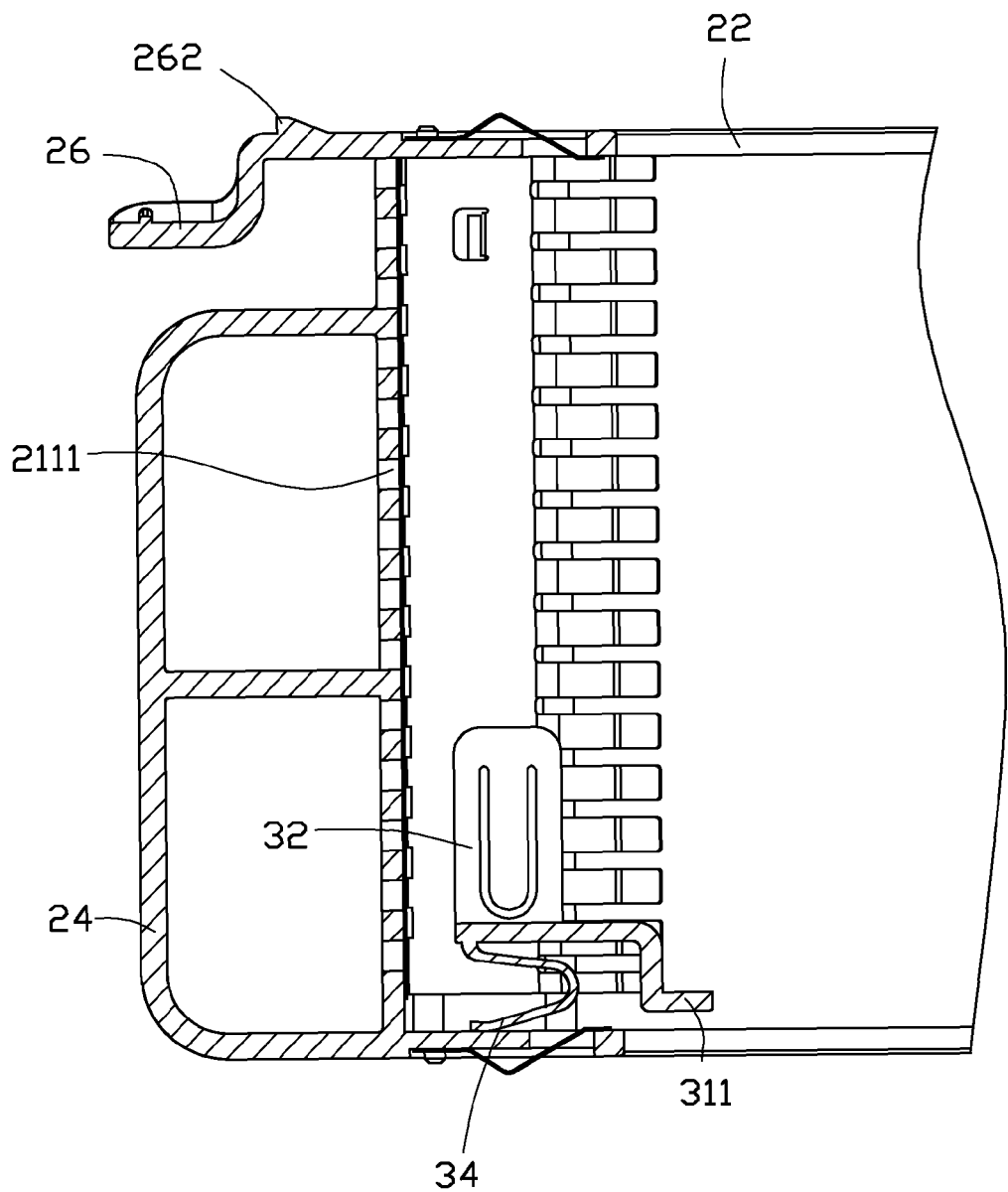
FIG. 4 is similar to FIG. 3, showing another use state of the electronic device module.

Referring to FIG. 4, when the data storage device 10 is not needed, the electronic device module is taken out from the enclosure thereby leaving an opening in the enclosure. The screws 90 are loosened and the data storage device 10 is detached from the rack 20. The resilient tab 34 restores and drives the movable member 30 inward. The through holes 411 of the shield 40 offset the ventilation holes 2111 of the rack 20, and the portions of the shield 40 between the through holes 411 completely cover the ventilation holes 2111. Then, the rack 20 is placed in the original place of the enclosure. Thus, the electronic device module without the data storage device 10 prevents EMI from leaking through the opening of the enclosure, and does not influence the airflow direction inside the enclosure.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device module comprising: an electronic device; a rack to accommodate the electronic device, the rack defining a plurality of ventilation holes; and a shield adjusting assembly defining a plurality of through holes; wherein the electronic device is placed in the rack to drive the shield adjusting assembly to a first position in which the through holes align with the ventilation holes; and wherein when the electronic device is detached from the rack, the shield adjusting assembly is restored by a resilient element to a second position in which the through holes offset the ventilation holes such that the ventilation holes are shielded, wherein the shield adjusting assembly comprises a shield and a movable member; the through holes are defined in the shield, the resilient element is sandwiched between the movable member and the rack, the movable member comprises a pressing plate resisting against a side of the electronic device.

2. The electronic device module of claim 1, wherein the rack comprises a main body and two parallel arms extending from the main body, the electronic device is mounted between the arms, the main body comprises a first sidewall and two second sidewalls extending from two opposite sides of the first sidewall, the shield adjusting assembly is retained in the main body, the ventilation holes are defined in the first sidewall.

3. The electronic device module of claim 2, wherein the second sidewalls of the main body of the rack each define two elongated sliding slots, the movable member comprises two mounting walls each forming two posts, the posts extend through two through holes of the shield and slidably engage in the sliding slots.

4. The electronic device module of claim 3, wherein the movable member is substantially U-shaped, and comprises a main body, and the two mounting walls in parallel extending from the main body, each mounting wall defines a U-shaped slot thereby an inner section of the U-shaped slot forming a resilient cantilever tab, the two posts are formed from a base end and a free end of the cantilever tab respectively.

5. The electronic device module of claim 4, wherein the pressing plate is substantially L-shaped and extends from an end of the main body of the movable member, and when the electronic device is placed in the rack, the pressing plate is moved outward by the electronic device to be located above one of the arms of the rack.

6. The electronic device module of claim 2, wherein one of the two second sidewalls of the rack defines an elongated latching slot, the shield forms a bent tab which slidably engages in the latching slot.

7. The electronic device module of claim 2, wherein the main body of the rack further comprises two third sidewalls extending from two opposite ends of the first sidewall and connecting the second sidewalls, two anti-EMI plates are attached to outer sides of the third sidewalls.

8. The electronic device module of claim 1, wherein the ventilation holes are arranged in matrix, and distance between every two adjacent columns of the ventilation holes is not less than the width of each ventilation hole, the through holes are arranged in matrix, and distance between every two adjacent columns of the through hole is not less than the width of each through hole, such that portions between the through holes is capable of completely covering the ventilation holes.

* * * * *